(12) United States Patent
Rand et al.

(10) Patent No.: US 10,615,345 B2
(45) Date of Patent: Apr. 7, 2020

(54) METHOD AND DEVICE FOR USING AN ORGANIC UNDERLAYER TO ENABLE CRYSTALLIZATION OF DISORDERED ORGANIC THIN FILMS

(71) Applicant: The Trustees of Princeton University, Princeton, NJ (US)

(72) Inventors: Barry P. Rand, Princeton, NJ (US); Michael A. Fusella, Lawrenceville, NJ (US); Siyu Yang, Redmond, WA (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 15/612,049

(22) Filed: Jun. 2, 2017

(65) Prior Publication Data

US 2017/0352720 A1    Dec. 7, 2017

Related U.S. Application Data

(60) Provisional application No. 62/345,490, filed on Jun. 3, 2016.

(51) Int. Cl.
*H01L 21/84* (2006.01)
*H01L 51/00* (2006.01)
(Continued)

(52) U.S. Cl.
CPC ...... *H01L 51/0034* (2013.01); *H01L 27/1274* (2013.01); *H01L 29/4908* (2013.01);
(Continued)

(58) Field of Classification Search
CPC ............ H01L 51/0034; H01L 51/0078; H01L 51/5012; H01L 51/504; H01L 51/5004;
(Continued)

(56) References Cited

U.S. PATENT DOCUMENTS

| 2002/0117962 | A1* | 8/2002 | Beierlein | ............ H01L 51/5088 313/504 |
| 2004/0031958 | A1* | 2/2004 | Wu | ...................... H01L 51/5012 257/40 |

(Continued)

OTHER PUBLICATIONS

Ajay K. Pandey and Jean-Michel Nunzi, "Rubrene/Fullerene HeterostructuresWith a Half-Gap Electroluminescence Threshold and Large Photovoltage", Nov. 5, 2007, Adv. Mater., 19, pp. 3613-3617. (Year: 2007).*

(Continued)

*Primary Examiner* — Allen L Parker
*Assistant Examiner* — Wasiul Haider
(74) *Attorney, Agent, or Firm* — Meagher Emanuel Laks Goldberg & Liao, LLP

(57) ABSTRACT

Measurements on organic single crystals reveal remarkable optical and electrical characteristics compared to disordered films but practical device applications require uniform, pinhole-free films. Disclosed herein is a process to reliably convert as-deposited amorphous thin films to ones that are highly crystalline, with grains on the order of hundreds of microns. The disclosed method results in films that are pinhole-free and that possess grains that individually are single crystal domains.

5 Claims, 2 Drawing Sheets

(51) Int. Cl.
    *H01L 29/49* (2006.01)
    *H01L 51/50* (2006.01)
    *H01L 27/12* (2006.01)

(52) U.S. Cl.
    CPC ...... *H01L 51/0002* (2013.01); *H01L 51/0026* (2013.01); *H01L 51/0035* (2013.01); *H01L 51/0046* (2013.01); *H01L 51/0052* (2013.01); *H01L 51/0055* (2013.01); *H01L 51/0078* (2013.01); *H01L 51/504* (2013.01); *H01L 51/5004* (2013.01); *H01L 51/5012* (2013.01); *H01L 51/0054* (2013.01)

(58) Field of Classification Search
    CPC ............. H01L 51/0055; H01L 51/0035; H01L 51/0052; H01L 51/0046; H01L 27/1274; H01L 51/0026; H01L 51/0002
    See application file for complete search history.

(56) References Cited

U.S. PATENT DOCUMENTS

| | | | | |
|---|---|---|---|---|
| 2005/0012451 A1* | 1/2005 | Yuki | ................ | H01L 51/56 313/504 |
| 2006/0066222 A1* | 3/2006 | Yoshida | ............ | H01L 27/3239 313/503 |
| 2006/0107996 A1* | 5/2006 | Shaheen | ............... | B82Y 10/00 136/263 |
| 2006/0158105 A1* | 7/2006 | Kim | ................... | H01L 51/5036 313/504 |
| 2008/0233827 A1* | 9/2008 | Kagami | ............. | H01L 51/0013 445/24 |
| 2008/0254568 A1* | 10/2008 | Setayesh | ............ | H01L 51/0012 438/99 |
| 2010/0159205 A1* | 6/2010 | Yang | .................. | H01L 51/0026 428/172 |
| 2012/0129296 A1* | 5/2012 | Rolin | ................ | C23C 16/45565 438/99 |
| 2014/0299869 A1* | 10/2014 | Kugler | ............... | H01L 51/0047 257/40 |
| 2015/0311445 A1* | 10/2015 | Udaka | .................. | H01L 27/307 257/40 |

OTHER PUBLICATIONS

Oxford Dictionaries, "substantially", Oxford Dictionaries, Apr. 2010, https://en.oxforddictionaries.com/definition/substantially. (Year: 2010).*

Tsz-Wai Ng et al., "Exciplex emission and its relationship with depletion organic heterojunction", May 27, 2012, Organic Electronics, vol. 13, Issue 9, pp. 1641-1645. (Year: 2012).*

Pil Sung Jo et al., "Control of Rubrene Polymorphs via Polymer Binders: Applications in Organic Field-Effect Transitors", May 19, 2015, Chem. Mater., 27 (11), pp. 3979-3987. (Year: 2015).*

Fangmin Jin et al., "Interface Engineering of Organic Schottky Barrier Solar Cells and Its Application in Enhancing Performances of Planar Heterojunction Solar Cells", May 17, 2016, Scientific Reports vol. 6, Article No. 26262, pp. 1-8. (Year: 2016).*

G.E. Jabbour et al.,"Screen printing for the fabrication of organic light-emitting devices", Sep.-Oct. 2001, in IEEE Journal of Selected Topics in Quantum Electronics, vol. 7, No. 5, pp. 769-773. (Year: 2001).*

Geoffrey B. Piland et al., "Magnetic Field Effects on Singlet Fission and Fluorescence Decay Dynamics in Amorphous Rubrene", Dec. 22, 2012, J. Phys. Chem. C2013, 117, 3, pp. 1224-1236. (Year: 2012).*

Qiusong Chen et al., "Determining the Origin of Half-bandgap-voltage Electroluminescence in Bifunctional Rubrene_C60 Devices", May 4, 2016, Scientific Reports vol. 6, Article No. 25331 (2016), pp. 1-9. (Year: 2016).*

Verreet, B, et al. "Microcrystalline Organic Thin-Film Solar Cell", Adv. Mater.25, 5504-5507 (2013).

Lee, H. M. et al. "Abrupt heating-induced high-quality crystalline rubrene thin films for organic thin-film transistors" Organic Electronics 12, 1446-1453 (2011).

Kim, J. J., et al. "Patterning of rubrene thin-film transistors based on electron irradiation of a polystyrene dielectric layer", J Mater. Chem. C, vol. 3, 2650-2655 (2015).

R. R Lunt, J. B. Benziger, and S. R. Forrest, "Relationship between Crystalline Order and Exciton Diffusion Length in Molecular Organic Semiconductors," Adv. Mater., vol. 22, No. 102, pp. 1233-1236, 2010.

C. D. Dimitrakopoulos and P. R. L. Malenfant, "Organic thin film transistors for large area electronics," vol. 14, No. 2, pp. 99-117, 2002.

H. Gleskova and S. Wagner, "Electron mobility in amorphous silicon thin-film transistors under compressive strain," Appl. Phys. Lett., vol. 79, No. 20, pp. 3347-3349, 2001.

J. Takeya, M. Yamagishi, Y. Tominari, R. Hirahara, Y. Nakazawa, T. Nishikawa, T. Kawase, T. Shimoda, and S. Ogawa, "Very high-mobility organic single-crystal transistors with in-crystal conduction channels," Appl. Phys. Lett., vol. 90, No. 10, p. 102120, 2007.

S.-W. Park, J. M. Hwang, .J.-M. Choi, D. K. Hwang, M. S. Oh, J. H. Kim, and S. Im, "Rubrene thin-film transistors with crystalline and amorphous channels," Appl. Phys. Lett., vol. 90, No. 15, p. 153512, 2007.

M. Coelle, .J. Gmeiner, W. Milius, H. Hillebrecht, and W. Bruetting, "Preparation and Characterization of Blue-Luminescent Tris (8-hydroxyquinoline)-aluminum (Alq3)," Adv. Funct. Mater, vol. 1a, No. 2, pp. 108-112, 2003.

S. Yin, Z. Shuai, and Y. Wang, "A Quantitative Structure-Property Relationship Study of the Glass Transition Temperature of OLED Materials," J. Chem. Inf. Comput. Sci., vol. 43, No. 3, pp. 970-977, 2003.

H. Kageyama, H. Ohishi, M. Tanaka, Y. Ohmori, and Y. Shirota, "High-Performance Organic Photovoltaic Devices Using a New Amorphous Molecular Material with High Hole Drift Mobility, Tris[4-(5-phenylthiophen-2-yl)phenyl]amine," Adv. Funct. Mater., vol. 19, No. 24, pp. 3948-3955, 2009.

C. Murawski, C. Fuchs, S. Hofmann, K. Leo, and M. C. Gather, "Alternative p-doped hole transport material for low operating voltage and high efficiency organic light-emitting diodes," Appl. Phys. Lett., vol. 105, No. 11, p. 113303, 2014.

Y. Divayana, X. Sun, B. Chen, G. Lo, K. Sarma, and D. Kwong, "Bandgap engineering in Alq3- and NPB-based organic light-emitting diodes for efficient green, blue and white emission," Solid. State. Electron., vol. 51, No. 11-12, pp. 1618-1623, 2007.

C. Uhrich, R. Schueppel, A. Petrich, M. Pfeiffer, K. Leo, E. Brier, P. Kilickiran, and P. Baeuerle, "Organic Thin-Film Photovoltaic Cells Based on Oligothiophenes with Reduced Bandgap," Adv. Funct. Mater., vol. 17, No. 15, pp. 2991-2999, 2007.

S. W. Park, J. M. Choi, K. H. Lee, H. W. Yeom, S. Im, and Y. K. Lee, "Amorphous-to-crystalline phase transformation of thin film rubrene," J. Phys. Chem. B, vol. 114, pp. 5661-5665, 2010.

D. K. Owens and R. C. Wendt, "Estimation of the surface free energy of polymers," J. Appl. Polym. Sci., vol. 13, No. 8, pp. 1741-1747, 1969.

J . H. Kim, J. Jang, and W. C. Zin, "Thickness dependence of the glass transition temperature in thin polymer films," Langmuir, vol. 17, No. 17, pp. 2703-2710, 2001.

* cited by examiner

METHOD AND DEVICE FOR USING AN ORGANIC UNDERLAYER TO ENABLE CRYSTALLIZATION OF DISORDERED ORGANIC THIN FILMS

CROSS-REFERENCE TO RELATED APPLICATIONS

This application claims the benefit of U.S. Provisional Application No. 62/345,490 filed Jun. 3, 2016, which is hereby incorporated in its entirety by reference.

STATEMENT REGARDING FEDERALLY SPONSORED RESEARCH OR DEVELOPMENT

This invention was made with government support under Grant # DE-SC0012458 awarded by the Department of Energy. The government has certain rights in the invention.

BACKGROUND OF THE INVENTION

Both small-molecule and polymer organic substances are used in optoelectronic devices. Semiconducting small molecules include polycyclic aromatic compounds such as pentacene, anthracene and rubrene. The aromaticity of these molecules means that the electrons across all adjacent parallel aligned p-orbitals are delocalized, forming the $\pi$-bonds. Charge transport among molecules, or conduction, is made possible by the overlap between $\pi$-orbitals in neighboring molecules.

There is a dependence of charge carrier diffusion length, mobility and hence material conductivity on the degree of long range order in the semiconducting material, with the highest mobility reserved for single crystals. The exciton diffusion length has been shown to increase with the crystallinity of the material. Time-of-flight experiments have determined the charge mobility in organic molecular crystals to be between 1 and 10 $cm^2$ $V^{-1}$ $s^{-1}$ at 300 K. Charge mobility is much lower than 1 $cm^2$ $V^{-1}$ $s^{-1}$ for disordered organic semiconductors, where band transport is not applicable and carrier transport takes place by hopping between localized states. In between the two extremes, polycrystalline organic semiconductor's charge transport is dominated by traps attributed to grain boundaries and other structural defects. For reference, the electron mobility in amorphous silicon is about 1 $cm^2$ $V^{-1}$ $s^{-1}$, and about $10^3$ $cm^2$ $V^{-1}$ $s^{-1}$ in crystalline silicon.

Among organic semiconductors, rubrene single crystals show the highest carrier mobility. Mobility values as high as 18-40 $cm^2$ $V^{-1}$ $s^{-1}$ have been measured in rubrene single-crystal field-effect transistors (FETs). On the other hand, rubrene thin-film FETs showed mobility of only about $1.2 \times 10^{-4}$ $cm^2$ $V^{-1}$ $s^{-1}$, using an as-deposited rubrene film that is a mixture of amorphous and crystalline phases with disk-like crystallites, 5 micrometers in diameter, mixed with amorphous rubrene.

Understanding the crystallinity in small-molecule organic semiconductors is also important in device-specific ways. For organic thin-film transistors, the molecules should be oriented so that the $\pi$-$\pi$ stacking direction is parallel to the channel to increase responsivity. For vertically oriented devices such as organic photovoltaics, the $\pi$-$\pi$ stacking should be along the junction direction to enhance diffusion length. Additionally for OPVs, light absorption is typically optimal when the molecular plane (when it aligns with the transition dipole moment) is perpendicular to the incident light and thus parallel to the oscillating electric field.

Thus the structural order of molecules in organic semiconductors influences both charge transport and light absorption. Although single crystals have the properties that lead to high device performance, scalability considerations such as roll-to-roll processing make it necessary to use the material in the thin-film form. In order to have the best of both worlds—the practicality of thin films and the high performance of single crystals—it is hoped that as-deposited amorphous films can be annealed to form polycrystalline films with large grains, or low density of grain boundaries.

Efforts to produce polycrystalline thin-film rubrene of the desired crystalline phase are not easily reproducible, however, and mechanisms in the crystallization procedure that enable complete, polycrystalline films with large and uniform grains to form are not well explained.

Thus, a scalable, highly reproducible method for producing polycrystalline thin films, especially methods that can be generalized to other organic small-molecule semiconductors, is highly desired.

BRIEF SUMMARY OF THE INVENTION

The present invention is drawn to a method for crystallizing disordered organic thin films using an underlayer, and devices created using such methods. The method generally requires depositing an underlayer onto a substrate, an organic layer on the underlayer, and annealing, where the bulk glass transition temperature of the underlayer material is less than the annealing temperature.

Among the many different possibilities contemplated, additional layers may advantageously be deposited onto the first layer. It is further contemplated that the difference between the glass transition temperature and the annealing temperature is at least 20 degrees Celsius, or that the bulk glass transition temperature be between 70 and 90 degrees Celsius.

It is further contemplated that the thickness of the underlayer be between 3 and 50 nm, the thickness of the first layer be between 10 and 100 nm, and/or that the underlayer have a surface energy of between 25 and 75 erg $cm^{-2}$. It is still further contemplated that the underlayer be comprised specifically of Tris[4-(5-phenylthiophen-2-yl)phenyl]amine (TPTPA) or, 4,4',4"-Tris[phenyl(m-tolyl)amino]triphenylamine (m-MTDATA), and that the first layer could be a polycyclic aromatic compound. It is also contemplated that the first layer be comprised specifically of rubrene or sub-phthalocyanine chloride (SubPc). It is further contemplated that the annealing process could advantageously be held constant, preferably around 100-250 degrees Celsius, for preferably between 4 to 8 minutes, and/or that the temperature can be capable of being increased to produce an increased number of grains in the thin film.

It is contemplated that this process will yield a device that includes an underlayer and a first organic layer. The device may also utilize a substrate layer, which may include Glass/ITO, glass, quartz, sapphire, silicon, silicon/silicon dioxide, or a polymer, and may also include a second or additional organic layer, which may or may not be the same material as the first organic layer, and may include materials such as $C_{60}$.

DETAILED DESCRIPTION OF THE INVENTION

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein. It must be noted that as used herein and in the appended claims, the singular forms "a", "an", and "the" include plural referents unless the context clearly dictates otherwise.

Figure 1:
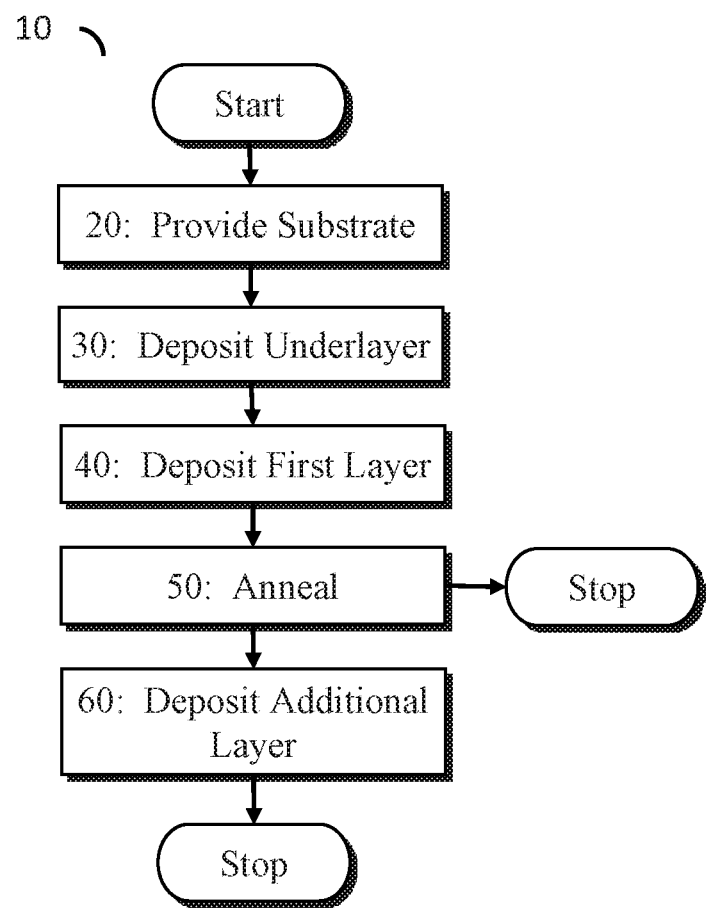
FIG. 1 is a flowchart of a generalized method for utilizing an organic underlayer to enable crystallization of disordered organic thin films.

FIG. 1 generally provides a flowchart for one embodiment of a method (10) for crystallizing disordered organic thin films. Initially a substrate is provided (20), and an underlayer is deposited (30) onto the substrate. A first organic layer is then deposited (40) over the underlayer. Following that, a polycrystalline thin film in the organic layer is generated by annealing (50), provided that the bulk glass transition temperature of the underlayer is less than the annealing temperature, and the difference between the bulk glass transition temperature and the annealing temperature is greater than a threshold. The annealing is preferably done at a substantially constant temperature (e.g., +/−2 degrees Celsius). In preferred embodiments, the threshold is 20 degrees Celsius. In other embodiments, the threshold is 40 degrees Celsius. In still other embodiments, the threshold is 60 degrees Celsius.

If additional layers are utilized, the layers can be deposited (60) as desired via, e.g., homo- or heteroepitaxy until the desired structure is complete.

Figure 2:
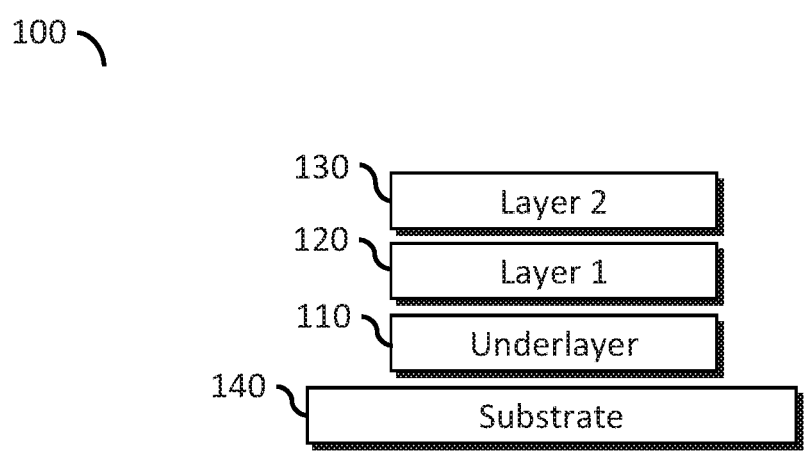
FIG. 2 is a cross sectional view of a device utilizing an organic underlayer and crystallized disordered organic thin films.

FIG. 2 depicts a structure of a device resulting from the method described in FIG. 1. The device (100) generally comprises an underlayer (110) on a substrate (140), with a first layer (120) on the underlayer (110), and a second layer (130) on the first layer (120).

In some embodiments, the underlayer (110) and substrate (150) are removed after the first layer has been crystallized.

Any appropriate substrate is envisioned, including but not limited to substrates that are comprised of glass/indium tin oxide (ITO), glass, quartz, sapphire, silicon, silicon/silicon dioxide, or a polymer.

The first layer (120) and second layer (130), as well as additional layers, are preferably organic small-molecule semiconductors, and more preferably polycyclic aromatic compounds. The thickness of these layers can vary widely, although preferred embodiments utilize first and/or second layers having mean thicknesses between about 10 and about 100 nm, and more preferably between about 20 nm and about 75 nm.

The underlayer provides additional rotational mobility to the molecules in the organic layer above it so that they can reorient better and form larger and more uniform grains. The glass transition temperature $T_g$ of the under-layer serves to quantify its fluidity at the annealing temperature.

For example, several organic small-molecule substances were tested as under-layers for rubrene thin films: Alq3 [Tris(8-hydroxyquinolinato)aluminium, Bulk $T_g$~178° C.]; NPB [N,N'-Bis(naphthalen-1-yl)-N,N'-bis(phenyl) benzidine, Bulk $T_g$~95° C.]; TPTPA [Tris[4-(5-phenylthiophen-2-yl)phenyl]amine, Bulk $T_g$~83° C.]; m-MTDATA [4,4',4"-Tris[phenyl(m-totyl)amino]triphenylamine, Bulk $T_g$~75° C.]; MeO-TPD [N,N,N',N"-tetrakis(4-Methoxy-phenyl)benzidine, Bulk $T_g$~67° C.]; and TPD [N,N'-bis(3-methylphenyl)-N,N'-diphenylbenzidine, Bulk $T_g$~58° C.].

Variables that determine which polymorph of rubrene will result from the annealing procedure include the under-layer material used, its thickness, the rubrene film's thickness, and the annealing temperature, rate and time. For each substance serving as the under-layer, the under-layer thickness, rubrene film's thickness and annealing temperature were varied to find the combination resulting in optimal rubrene crystallization.

The annealing rate was fixed by applying "abrupt-heating" with a preheated hot plate, so that the heating rate was very high. The annealing time mostly affected the completeness of the film and if there would be desorption from the substrate, not the resulting polymorph, so it was kept constant during each run, but across all experiments it was between two and seven minutes. However, note that this time may vary; in preferred embodiments, the annealing time was between about 2 and about 10 minutes; in more preferred embodiments, it was annealed for between about 4 and about 8 minutes.

The experimental procedure was the same for all test under-layer substances in the experiment. An extra run was done using Alq3 to contrast with rubrene films without an under-layer.

For each under-layer substance, a first run was conducted to determine the most promising under-layer thickness, and a second run was done using an under-layer of that thickness while varying the thickness of the rubrene film. In both runs, the substrate was annealed at four or five temperatures to observe the effect of annealing temperatures.

On the back of each ITO-coated glass substrate, a cross was drawn using a diamond pen. This allows the substrate to be diced into four squares after deposition, so more annealing temperatures could be experimented with per substrate.

The substrates were then cleaned by ultrasonic treatment in de-ionized water, acetone and isopropanol, for 20 minutes each and blow-dried with nitrogen in between. After each square on the substrate was labeled on the back, they were cleaned with oxygen plasma for 10 minutes in a vacuumed chamber. The under-layer material and rubrene were deposited on the substrate by thermal evaporation.

As explained, for each candidate material for the under-layer, two runs were made to first choose a promising under-layer thickness, and then to optimize for rubrene film thickness. In the first run, the under-layer material was first deposited with a different thickness for each substrate, ranging from 3 nm to 20 nm, followed by 20 nm of rubrene for all substrates. One thickness for each under-layer material was chosen to continue the experiment. The selected option was the thickness of under-layer that led to the most complete rubrene films with the most single-colored platelet crystallites.

In the second run, an under-layer of the thickness determined by the first run was deposited, which happened to be 5 nm for all four materials. This was followed by depositing a different thickness of rubrene for each substrate. The under-layer was deposited at 0.5 Å s$^{-1}$ and rubrene at 1 Å s$^{-1}$, in a vacuum of base pressure of approximately 10$^{-7}$ Torr at room temperature.

The dicing and annealing of the samples took place in a nitrogen atmosphere. The substrate, now covered with the under-layer and rubrene, was diced with a ruler. Each of the four squares of a substrate was annealed at a different temperature so four annealing temperatures could be observed in each run.

The annealing set-up was as follows: a small metal plate was placed at the center of a hot plate, and it was heated to the desired annealing temperature and allowed to stabilize. After annealing the sample by placing it on the metal plate for the designated duration, the sample was cooled on a cleanroom wipe. The samples were then taken out of the nitrogen glove box to be observed and imaged under a polarized optical microscope (POM) immediately. Images of each sample were taken. Each square was observed under the POM with 5× magnification and a typical area was then photographed. If there were interesting features or crystalline structures, higher magnification of up to 20× were used to image them. In general, at least one picture was taken for each of the squares at the boundary between substrate covered with ITO and without, so that the crystallization of film deposited both on top ITO and on glass can be observed. POM images reveal single colored grains on the order of 100s of microns, sometimes exceeding 1 mm. Electron backscatter diffraction (EBSD) confirms that single-colored grains have the same diffraction pattern and are thus single crystal domains. Further, these films are typically pinhole-free.

The glass transition temperature $T_g$ was determined by ellipsometry for NPB, TPTPA, m-MTDATA and MeO-TPD for a range of thicknesses, summarized in the table below.

The measurement of $T_g$ for the 20 nm film of m-MTDATA was repeated using a different film because the first measurement seemed out of trend compared to the $T_g$ of other materials. The results were 87±9° C. and 84±9° C. respectively, and their average is recorded in the table. For the $T_g$ measurement of TPTPA films, unpurified TPTPA had to be used, and so these films' thicknesses were determined after deposition because the correct tooling factor was not available beforehand. Alq3 started crystallizing before showing any glass transition and so its thin-film $T_g$ was not found; this was confirmed by examining the Alq$_3$ samples after its heating scan under POM.

The surface energies of the under-layer materials calculated from contact angle measurements are summarized in the following table. The surface energy of as-deposited amorphous rubrene could not be measured with the set-up utilized because it readily oxidizes when exposed to light and air.

| Material | Surface energy (erg cm$^{-2}$) |
| --- | --- |
| ITO on glass | 71.11 ± 0.01 |
| Alq$_3$ | 36.3 ± 2.2 |
| NPB | 29.2 ± 3.4 |
| TPTPA | 27.1 ± 0.4 |
| m-MTDATA | 30.5 ± 3.9 |
| MeO-TPD | 30.2 ± 5.3 |
| TPD | 40.0 ± 5.6 |

From the resulting rubrene films it is seen that the effect of the under-layer is indeed significant. The criteria for good polycrystalline rubrene films are completeness of coverage, prevalence of grains that are uniformly colored under POM, and the size of the grains (low density of grain boundaries). In the above experiment, m-MTDATA serving as under-layer produced the best rubrene films, comparable to the effect of TPTPA, although perhaps the grains are slightly less uniformly colored under POM. The experimental condition that produced the optimal film using m-MTDATA is very similar to that using TPTPA. The two films both had around 20 nm of rubrene on top of 5 nm of the under-layer material, and both were annealed at around 140° C.

While unfortunately the ellipsometry set-up did not allow $T_g$ of films thinner than 20 nm to be measured, $T_g$ of thicker films showed that the known model of $T_g$ depression in polymers also describes $T_g$ depression in organic small-molecule films. The inverse of film thickness is linearly related to the inverse of the film's $T_g$ for thickness in the range of about 20 nm to 70 nm.

The slopes of the linear relationship for the four substances measured are in good agreement given the uncertainties. This shows that $T_g$ decreases at the same rate for these materials, which supports the assumption that the $T_g$ of 5 nm films of the various small molecules will be in the same order as $T_g$ of the bulk (or thicker films).

| Material | Bulk $T_g$ from Literature (° C.) | $T_g$ at 70 nm | $T_g$ at 50 nm | $T_g$ at 30 nm | $T_g$ at 20 nm |
| --- | --- | --- | --- | --- | --- |
| NPB | 95 | 115 ± 14 | 115 ± 11 | 109 ± 9 | 103 ± 19 |
| m-MTDATA | 75 | 92 ± 8 | 90 ± 6 | 87 ± 9 | 85 ± 9 |
| MeO-TPD | 67 | 80 ± 10 | 79 ± 11 | 76 ± 11 | 66 ± 15 |
| | | $T_g$ at 79.6 nm | $T_g$ at 58.4 nm | $T_g$ at 37.2 nm | $T_g$ at 26.5 nm |
| TPTPA | 83 | 98 ± 1 | 97 ± 6 | 95 ± 11 | 94 ± 14 |
| TPD | 58 | 74 ± 9 | 73 ± 9 | 71 ± 30 | N/A |

It is noted that as the $T_g$ of the crystalline film increases, the $T_g$ range for preferred embodiments of an underlayer also increases. Thus, while a preferred underlayer for rubrene has a $T_g$ range between 70 and 90° C., for materials having a $T_g$ higher than that of rubrene, the $T_g$ range for a preferred underlayer will also increase. Similarly, for materials having a $T_g$ lower than that of rubrene, the $T_g$ range for a preferred underlayer will likely decrease.

The five under-layer materials investigated are measured to have surface energy in the range of 27 to 36 erg $cm^{-2}$, much lower than the 71 erg $cm^{-2}$ of ITO on glass. This confirms that the amorphous organic substances all have low-energy surfaces as the intermolecular interaction in these materials is much weaker than covalent bonding in ITO or glass, which are high-energy surfaces. Alq3 has a higher surface energy compared to NPB and TPTPA, taking the uncertainties into account. It is also observed that NPB, m-MTDATA and MeO-TPD have approximately the same surface energy of around 30 erg $cm^{-2}$, slightly higher than that of TPTPA. However, within the limits of the uncertainties, TPTPA, NPB, m-MTDATA, MeO-TPD and TPD have approximately the same surface energy. From the above two sets of measurements, it can be concluded that for rubrene films, the surface energy of the under-layer needs to be low enough, or around 30 erg $cm^{-2}$, since the surface energy of ITO on glass is much higher and it is not conducive to rubrene forming large grains. This is possibly because matching surface energy leads to good adhesion with the rubrene film above.

The above experiments again did not reproduce the result of growing polycrystalline rubrene films with platelet grains directly on ITO/glass, either at $T_a$ of around 170° C. reported in previous studies or at around 140° C., the $T_a$ producing the best film when using TPTPA as an under-layer. From results of annealing without an under-layer at $T_a$ from 140 to 170° C. at 10° C. intervals, it can be seen that at low $T_a$, crystallites in the triclinic phase dominate with a few scattered platelet crystallites of the orthorhombic phase. As $T_a$ increases, the films become dominated by spherulitic growth often with patches or centers of triclinic crystallites. The "Maltese cross" pattern characteristic of spherulites is clearly observable. A closer look at individual spherulites reveals that indeed the grain boundary density is very high: fibre-like crystallites are often distinguishable from their neighbors in the birefringent pattern.

Using $Alq_3$ as the under-layer also produced poorer results, but some improvement in film completeness and some reduction in triclinic crystallites can be observed by comparing the gathered images with those without any under-layer. The effect of $Alq_3$ compared to other under-layers supports the argument that fluidity of the under-layer molecules gives additional rotational mobility to rubrene molecules: during Tg measurements, $Alq_3$ was shown to crystallize before showing any increase in volume (fluidity).

The improvement in comparison to ITO on glass could be an effect of better matched surface energy: the surface energy of ITO on glass was measured to be 71.11±0.01 erg $cm^{-2}$, while that of $Alq_3$ was 36.3±2.2 erg $cm^{-2}$. While unable to measure the surface energy of amorphous rubrene because it too readily oxidizes, it can be inferred from the surface energy of TPTPA (27.1±0.4) that this would be the desirable range of surface energy of the under-layer.

When examining the collected POM images, it can be seen that for rubrene, having a $T_a$ lower than about 140° C. results in a film that still has pockets of amorphous rubrene; those areas appear completely dark under the crossed polarizers of the POM. At $T_a$ above 160° C., the film becomes covered by large spherulites exhibiting the Maltese cross birefringent pattern. The transition from partially crystallized rubrene film to complete film with spherulites as $T_a$ increases is one of the most consistent trends in all of the experiments.

Consider NPB and MeO-TPD; these two materials have $T_g$ higher or lower than that of both TPTPA and m-MTDATA, respectively. It can be seen that as $T_a$ increases, both go from incomplete films to films with some platelet crystallites to all spherulites, yet neither of them attains films with all platelets with low grain boundary density throughout. This indicates there is a very specific range of under-layer $T_g$, above or below which rubrene cannot crystallize into platelet grains easily. Thus there seem to be two considerations to forming an ideal thin rubrene film: the fluidity of the under-layer material quantified by its $T_g$, and the annealing temperature $T_a$ conducive to rubrene forming large and uniform grains.

There is also an optimum thickness of the organic layer (here, rubrene) in conjunction with the under-layer. Annealing a thinner or thicker rubrene film would result in either incomplete crystallization or grains with a larger number of domains (more spherulitic). Since homoepitaxial growth of rubrene on top of polycrystalline films has been shown to propagate the crystalline order, the required film thickness for fabricating devices can always be achieved.

In considering the effect of the under-layer thickness, it is noted that even though $T_g$ rises as thickness of the under-layer increases, nucleation is hindered and fibre-like growth observed. It is a consistent trend for all under-layer materials that rubrene crystallization becomes suppressed as the thickness of the under-layer increases from about 2 nm to about 30 nm. As the under-layer thickness increases for a given material, rubrene crystallites become smaller and more fibre-like while the uncrystallized regions increase in proportion. Thus, in some embodiments, having a thin under-layer, with a thickness between 3 and 7 nm, is preferred.

However, in other embodiments, the target thickness range may differ. For example, when utilizing subphthalocyanine chloride (SubPc), thicknesses of up to about 50 nm formed acceptable thin films, with preferred embodiments having thicknesses of between about 20 nm and about 35 nm. A specific example of this includes a 30 nm film of SubPc with a 20 nm thick underlayer of NPB on glass/ITO, annealed at 140° C.

This leads to the proposition that even though thickness variation is equivalent to varying $T_g$ of the under-layer, the effect is a general suppression of crystallization with thicker under-layer, rather than affecting the phase of the resulting rubrene polycrystals as increase in $T_g$ would. For example, the $T_g$ of MeO-TPD at 70 nm approaches that of TPTPA at 20 nm, but that MeO-TPD films thicker than 20 nm leads to very little crystallization of rubrene. The finding that varying under-layer thickness is not a substitute for $T_g$ of the material at 5 nm again points to the complexity of the phenomenon.

A model of general spherulitic growth explains rubrene's crystallization: for an amorphous solid at temperatures conducive to crystallization, the rate of translational diffusion in its molecules exceeds the rate of rotational diffusion, and thus the propagation of the crystalline interface becomes faster than the reorientation of molecules, inducing the highly polycrystalline growth of spherulites. The TPTPA under-layer, whose glass transition temperature is below the annealing temperature, provides additional rotational mobility to the rubrene molecules above it so that they can reorient better and form larger and more uniform grains. The glass transition temperature $T_g$ of the under-layer serves to quantify its fluidity at the annealing temperature.

Surface energy of the under-layer is preferably around or lower than 30 erg cm$^{-2}$ and that $T_g$ is preferably within about 10° C. of the $T_g$ of TPTPA (e.g., about 70-90° C., or 75-95° C.) in order for polycrystalline rubrene to cover the entire film with large and uniform grains. However, preferred surface energies for the organic underlayer can vary; in some embodiments, the surface energy may be between about 25 and about 75 erg cm$^{-2}$, and preferably between about 25 and about 45 erg cm$^{-2}$.

A method for crystallizing a substance similar to rubrene to achieve low grain boundary density is to find an underlayer substance that has a low energy surface and a $T_g$ significantly below the annealing temperature; the underlayer thickness and other parameters such as annealing temperature and the exact $T_g$ range will need to be optimized for the specific substance requiring crystallization.

The finding that the $T_g$ of the under-layer needs to be within a specific range for a given crystalline material supports the explanation that the under-layer's role is to provide extra rotational mobility. The situation is very complex however, since if the under-layer is too fluid, as is likely the case with MeO-TPD, then the balance between translational and rotational mobilities of the rubrene molecules may again change to favor spherulitic growth.

Additional layers can also be added to the structure, and the crystallized organic layer will act as a template. As an example of homoepitaxy, an adlayer of 75 nm of rubrene was deposited on a 5 nm TPTPA/25 nm rubrene structure, and the resulting film grains retain their uniform color and sizes comparable to the original structure. Additionally, Atomic force microscopy (AFM) images reveal a very smooth template with molecular terraces, and adlayer island growth with crystal defects such as screw dislocations, whether the adlayer was grown at 0.1 Å s$^{-1}$ or 1 Å s$^{-1}$.

Alternatively, as an example of the impact of heteroepitaxy, $C_{60}$ grown atop the same 5 nm TPTPA/25 nm rubrene crystalline structure forms ~200 nm grains and traces out the molecular terraces on the crystal template. Rubrene molecules adopt the orthorhombic crystal structure with the (h00) planes parallel to the substrate (a-axis out of plane). The $C_{60}$ grown atop the crystalline rubrene film adopts a highly oriented face-centered cubic crystal phase with the (111) plane parallel to the substrate.

Devices made from these structures show unique properties. For example, solar cells made from these highly crystalline films of rubrene and $C_{60}$ allow the measurement of photocurrent from multiple charge transfer states, underscoring the implications of highly ordered systems on photocurrent generation.

Thus, specific methods and systems for crystallizing disordered thin films utilizing underlayers have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed:

1. A film structure, comprising:
   An underlayer comprising a first organic material having a first glass transition temperature; and
   a first layer at least partially connected to at least one surface of the underlayer, the first layer comprising a polycrystalline organic material;
   wherein the underlayer has a first glass transition temperature between and including 70 to 90 degrees C., and
   wherein the first layer has a mean thickness between and including 10 and 100 nm, and wherein the first layer comprises single colored grains as determined using a polarized optical microscope, each grain having a size between and including 100 micron and 10 mm.

2. The film structure according to claim 1, wherein the first organic material is at least one of Tris[4-(5-phenylthiophen-2-yl)phenyl]amine (TPTPA), 4,4'',4''-Tris[phenyl(m-tolyl)amino]triphenylamine (m-MTDATA).

3. The film structure according to claim 1, wherein the polycrystalline organic material is selected from the group consisting of rubrene or subphthalocyanine chloride (SubPc).

4. The film structure according to claim 1 further comprising a second layer comprising a crystalline material at least partially connected to a surface of the first layer, the second layer having a grain size between and including 100 nm to 10 mm.

5. The film structure according to claim 4, wherein the crystalline material is $C_{60}$.

* * * * *